United States Patent [19]
Hansen et al.

[11] Patent Number: 6,000,951
[45] Date of Patent: *Dec. 14, 1999

[54] ELECTRICAL RIBBON WIRE CONNECTORS

[75] Inventors: Scott A. Hansen, Holland; James T. Wilkinson, Grand Haven; Nels R. Smith, Holland, all of Mich.

[73] Assignee: Prince Corporation, Holland, Mich.

[*] Notice: This patent issued on a continued prosecution application filed under 37 CFR 1.53(d), and is subject to the twenty year patent term provisions of 35 U.S.C. 154(a)(2).

[21] Appl. No.: 08/820,056

[22] Filed: Mar. 18, 1997

[51] Int. Cl.⁶ ....................................................... H01R 9/07
[52] U.S. Cl. ................................ 439/67; 439/77; 439/496
[58] Field of Search ............................... 439/67, 77, 495, 439/496, 492, 499

[56] References Cited

U.S. PATENT DOCUMENTS

| | | |
|---|---|---|
| 3,200,364 | 8/1965 | Forney, Jr. . |
| 3,226,668 | 12/1965 | Baer et al. . |
| 3,255,429 | 6/1966 | Forney, Jr. . |
| 3,768,062 | 10/1973 | Michaels . |
| 3,893,745 | 7/1975 | Codrino . |
| 3,897,130 | 7/1975 | Donnelly et al. . |
| 3,989,336 | 11/1976 | Rizzio, Jr. et al. . |
| 4,410,222 | 10/1983 | Enomoto et al. . |
| 4,474,420 | 10/1984 | Nestor . |
| 4,526,432 | 7/1985 | Cronin et al. ............................. 439/67 |
| 4,526,436 | 7/1985 | Aso . |
| 4,533,188 | 8/1985 | Miniet . |
| 4,550,961 | 11/1985 | Aicher et al. . |
| 4,684,183 | 8/1987 | Kinoshita et al. . |
| 4,700,997 | 10/1987 | Strand . |
| 4,718,859 | 1/1988 | Gardner . |
| 4,734,053 | 3/1988 | Imai ....................................... 439/495 |
| 4,768,969 | 9/1988 | Bauer et al. . |
| 4,808,113 | 2/1989 | Kanesige et al. . |
| 4,811,165 | 3/1989 | Currier et al. . |
| 4,824,391 | 4/1989 | Ii . |
| 4,857,010 | 8/1989 | Ponn . |
| 4,886,942 | 12/1989 | Lenz ....................................... 439/493 |
| 4,890,381 | 1/1990 | Dubois et al. .......................... 439/495 |
| 4,900,268 | 2/1990 | Kunishi . |

(List continued on next page.)

FOREIGN PATENT DOCUMENTS

| | | |
|---|---|---|
| 1808453 | 1/1971 | United Kingdom . |
| 1280477 | 7/1972 | United Kingdom . |
| 2394904 | 1/1979 | United Kingdom . |
| 0269248 | 6/1988 | United Kingdom . |

*Primary Examiner*—Neil Abrams
*Attorney, Agent, or Firm*—Price, Heneveld, Cooper, DeWitt & Litton

[57] ABSTRACT

A connector for ribbon-to-wire conductors includes a clip for holding a ribbon conductor and a housing for retaining a series of wire conductors. To connect the system, a ribbon conductor containing exposed conductors on one surface of its free end is extended over the free end of an upper segment of the clip which is then inserted into the opening of the housing until a shoulder on the base of the clip engages the back wall of the housing locking the clip containing the ribbon conductor to the housing. In another embodiment of the electrical connecting system, a housing and a retainer snap together to sandwich exposed electrical contacts of two ribbon conductors and/or electrical surface contacts of a flexible or rigid circuit board. To connect the system, the ribbon conductors are placed over opposite ends of the circuit board to engage contacts thereon and the retainer is snapped to the housing. In yet another embodiment of the electrical conductor connecting system, a ribbon conductor is placed on a mandrel that has locating posts at its outer edges to align the apertures of the ribbon conductor with the apertures in the mandrel. To connect the system, a female connector/wire harness is pushed onto the mandrel so the pins of the female connector/wire harness pass through the deformable apertures in the ribbon conductor and the mandrel to provide an electrical connection between the exposed electrical contacts of the ribbon conductor and the pins of the wire conductors. In another embodiment, ribbon connectors are to be located over a mandrel and interconnected by use of a clip.

29 Claims, 5 Drawing Sheets

U.S. PATENT DOCUMENTS

| | | |
|---|---|---|
| 4,913,656 | 4/1990 | Gordon et al. . |
| 4,969,840 | 11/1990 | Ii et al. . |
| 5,026,291 | 6/1991 | David . |
| 5,040,997 | 8/1991 | Garner ........................................ 439/77 |
| 5,046,954 | 9/1991 | Schmedding .............................. 439/593 |
| 5,051,366 | 9/1991 | Anderson et al. ........................ 439/67 |
| 5,133,667 | 7/1992 | Daughtrey ................................. 439/67 |
| 5,181,854 | 1/1993 | Masuda . |
| 5,201,661 | 4/1993 | Ii . |
| 5,213,534 | 5/1993 | Gardner et al. .......................... 439/495 |
| 5,238,428 | 8/1993 | Brakenridge et al. . |
| 5,252,091 | 10/1993 | Fujita et al. . |
| 5,266,048 | 11/1993 | Brekosky et al. . |
| 5,281,170 | 1/1994 | Murphy . |
| 5,338,221 | 8/1994 | Bowen et al. . |
| 5,344,338 | 9/1994 | Colleran et al. . |
| 5,356,308 | 10/1994 | Toba et al. . |
| 5,358,412 | 10/1994 | Maurinus et al. ........................ 439/66 |
| 5,358,424 | 10/1994 | Bowen et al. . |
| 5,409,396 | 4/1995 | Bowen et al. . |
| 5,417,581 | 5/1995 | Dechelette et al. . |
| 5,428,513 | 6/1995 | Hiemstra et al. . |
| 5,433,632 | 7/1995 | Cherney et al. ........................ 439/495 |
| 5,447,442 | 9/1995 | Swart . |
| 5,456,616 | 10/1995 | Fuerst et al. . |
| 5,458,498 | 10/1995 | Ii et al. . |
| 5,484,186 | 1/1996 | Van Order et al. . |
| 5,525,072 | 6/1996 | Kunishi . |
| 5,548,488 | 8/1996 | Hansen .................................... 361/815 |

ELECTRICAL RIBBON WIRE CONNECTORS

BACKGROUND OF THE INVENTION

The present invention relates to electrical connectors and particularly to electrical connectors for connecting ribbon conductors to either wire conductors or other ribbon cable conductors.

Various press-fit type structure and methods of interconnecting electrical circuit components and conductors which use multiple connector structures are known and function generally to eliminate the need for using hard wire, e.g., solder, connections. One type of connector includes a two-piece structure. One piece is a member over which a ribbon conductor having exposed conductors at one end is placed, and the other is a housing for holding a series of conductors and a corresponding series of electrical contacts. One way to maintain electrical and mechanical connection in such a system is to incorporate a force generating feature in one of the structures which operates to press and hold the electrical contacts against each other when the two structures are engaged. However, in such systems, the force-generating feature is subject to deterioration over time and adds a degree of complexity and expense to the system.

In another press-fit type structure of interconnecting electrical circuit components or conductors, two ribbon conductors are connected to a third flexible or rigid circuit board. In such systems, the circuit components or conductors are sandwiched by a series of connecting structures. In these systems, the connector structures are of a size that accommodates the mounting of circuit components on the circuit board. An undesirable characteristic of known electrical connectors of this type is that they require separate fastening means such as screws. Therefore, although these electrical connectors can connect three separate electrical components or conductors, the user must utilize tools to connect/disconnect the system. In addition, these systems are limited in their application because they can only connect flat electrical conductors, i.e., they cannot connect electrical connectors that have electrical components mounted thereon.

Another press-fit type connector includes a first structure containing a means for holding a ribbon cable, and a second structure, such as a wire harness, containing a means for mounting wire conductors. In such a system, the two structures can be snapped together to bring the conductors of each component into contact to maintain an electrical connection. These systems have separate connecting means in the wire harness to provide the mechanical connection between the wire harness and the ribbon cable mounting structure. The connecting means in such systems often contains mechanisms which are complicated, expensive to manufacture and can be easily destroyed. U.S. Pat. No. 5,548,488 overcomes some of these mechanical limitations by providing a mounting system which connects an electrical component to a flat flexible circuit. The flexible circuit is attached to a substrate and contains apertures which align with apertures in the substrate. When the connecting pins of an electrical component pass through these apertures, an electrical and mechanical connection is maintained. However, this system is limited in its application. Specifically, it does not couple the conductors of a ribbon cable to corresponding conductors of a wire harness. As a result, there exists a need for adaptable systems for connecting a variety of ribbon-type conductors to wire conductors which minimize the complexity of the connecting structures while still maintaining the integrity of the mechanical and electrical connection of the different style conductors.

SUMMARY OF THE PRESENT INVENTION

The systems of the present inventions provide solutions to problems associated with the above types of electrical connecting systems. In one embodiment of the invention, the system includes a clip for holding a ribbon conductor and a housing for retaining a series of wire conductors. The housing includes an open end, a closed end and a series of channels in its interior for holding a corresponding series of electrical contacts that are connected to the wire conductors. The contacts are made of flexible metal and are folded over within the housing to maintain a spring-like contact pressure. The mating clip contains a base and an upper segment parallel to and spaced from the base by a curved segment which connects the base and upper segment. The base, upper and curved segments define a U-shaped clip which is integrally formed, preferably molded from a polymeric material. In addition, the base contains a shoulder at an end of said base.

To connect the system, a ribbon conductor containing exposed conductors on one surface of its free end is extended over the free end of the upper segment of the clip. The upper segment of the clip is then inserted into the opening of the housing until the shoulder of the base engages the back wall of the housing, locking the clip containing the ribbon conductor to the housing. The free ends of the flexible electrical contacts extend into the space defined by the housing and engage the compressed flexible electrical contacts to maintain the electrical connection. The connector, thus, insures a true electrical and mechanical connection without incorporating a force-generating feature in either the clip or the housing and is easy to use and inexpensive to produce.

In another embodiment of the electrical connecting system, a housing and a retainer snap together to sandwich the exposed electrical contacts of two ribbon conductors and electrical surface contacts of a flexible or rigid circuit board. The retainer is rectangular and has opposed raised edges which lock over the ends of the housing and prevent lengthwise movement of the circuit board which is seated within the retainer when the connector is assembled. To connect the system, the ribbon conductors are placed over opposite ends of the circuit board to engage contacts thereon, and then the retainer is snapped to the housing. In a preferred embodiment, the housing is solid, essentially rectangular, and has edges adapted to engage two edges (or, in an alternate embodiment, four edges to couple a second pair of ribbon conductors) of the retainer when the housing and retainer are snapped together.

The housing has an essentially rectangular bottom surface that has a recess which is of sufficient volume to accommodate electrical components mounted on the flexible or rigid circuit board. In addition, each end of this bottom surface has pins which extend out of the rib. When the system is assembled, these pins extend through the apertures of the ribbon conductors, the flexible circuit board and the retainer to insure that the components are properly aligned and the integrity of the electrical connection is maintained. When snapped into place, the edges of the retainer engage the edges of the housing with the ribbon conductors therebetween. As a result, the system provides strain relief for the ribbon conductors at the edges. Furthermore, the edges of the housing may have a series of raised ridges defining pressure points stamped into the housing and which align with the conductors of the ribbon conductors when the user assembles the system. By forcing the retainer to grip the housing at each conductor on the ribbon conductors, the "pressure points" operate to further increase the integrity of the electrical connection.

Note that the housing can be free-floating or molded into a "target" substrate. For example, the housing could be molded into a substrate behind the headliner of a vehicle. This configuration is low cost and, in the headliner application, lends serviceability to the interior electronics of the vehicle. Also, although the circuit board is susceptible to ripping, this housing/retainer system provides total protection for each component.

In yet another embodiment of the electrical conductor connecting system, a mandrel contains locating posts and a series of apertures to receive male terminals of a wire harness. The wire harness includes a series of wires and contact pins attached thereto within the female connector. The ribbon conductor has a series of apertures containing electrical contacts connected to the individual conductors of the ribbon conductor. When the ribbon conductor is placed on the mandrel, locating posts at the outer edges of the mandrel maintain the ribbon conductor in alignment with the apertures in the mandrel. When the male terminals and wire harness are pushed onto the mandrel, the pins of the wire terminals pass through the apertures in the ribbon conductor and the mandrel to provide an electrical connection between the exposed electrical contacts of the ribbon conductor and the pins of the wire conductors. After the pins of the wire harness pass through the apertures in the mandrel a predetermined distance, a stop internal to the female connector engages the top surface of the mandrel to prevent further downward movement of the wire harness. The apertures of the electrical contacts of the ribbon conductor are selected to be slightly smaller than the pins of the wire harness and, therefore, "grip" the pins of the wire harness when inserted therein. Also, when the wire harness is pushed onto the mandrel, the inner walls of the wire harness engage the outer walls of the mandrel to hold the connector to the mandrel. As a result, the system achieves a cost-effective yet high quality ribbon-to-wire connection.

These and other features, objects and advantages of the present invention will become apparent upon reading the following description thereof together with reference to the accompanying drawings.

DETAILED DESCRIPTION OF THE PREFERRED EMBODIMENT

Figure 1:
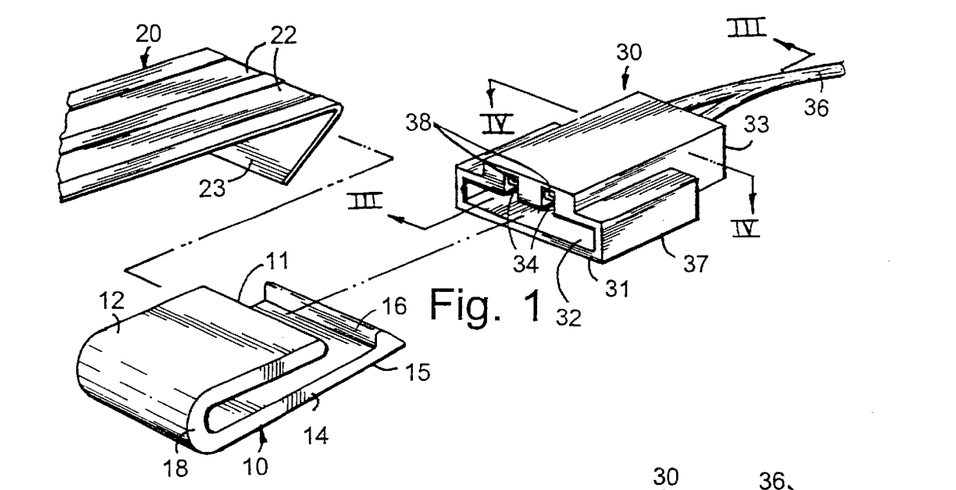
FIG. 1 is a perspective view of one embodiment of the invention showing a clip, a ribbon conductor and a wire conductor housing prior to assembly.

Referring initially to FIG. 1, there is shown the components of an electrical conductor connecting system including a clip 10, a ribbon conductor 20 and a housing 30. The generally U-shaped integral clip 10 includes a base 14 and an upper leg 12 which is parallel to and spaced from the base by a curved end 18. In addition, the base 14 contains a raised locking shoulder 16 at its free end 15. The upper parallel leg 12 of clip 10 has a free end 11 over which the free end 23 of a ribbon conductor 20 is wrapped.

Figure 3:
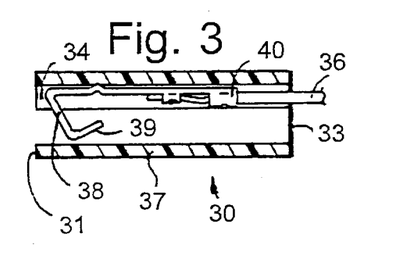
FIG. 3 is a cross-sectional side view of the housing taken along section line III—III of FIG. 1.
Figure 4:
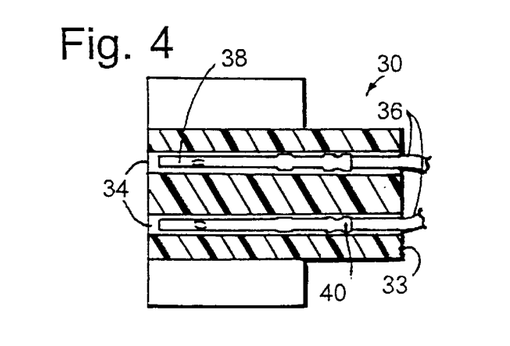
FIG. 4 is a cross-sectional view of the housing taken along section line IV—IV of FIG. 1.

The generally rectangular housing 30 defines an opening 32 and has a closed end 33. Housing 30 contains a series of channels 34 formed therein which receive corresponding flexible electrical contacts 38. The series of electrical contacts 38 are connected to wire conductors 36 with an attaching means such as a crimp connector 40 (FIG. 3). The flexible electrical contacts 38 contained within the channels 34 of the housing 30 are folded over into a C-shape, as best shown in FIG. 3. As a result, the free ends 39 of the electrical contacts 38 extend into the spaced defined by the housing 30 and maintain a spring pressure to insure electrical contact when the clip is inserted into the housing.

Figure 2:
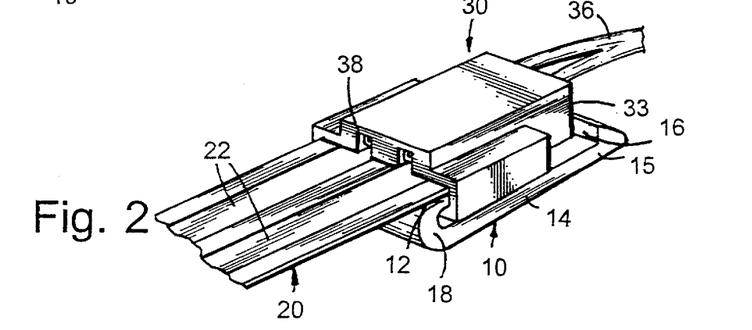
FIG. 2 is a perspective view of the system of FIG. 1, shown in a fully assembled position.

Turning to FIG. 2, the connector of the first embodiment is shown fully assembled. After the free end 23 of the ribbon conductor 20 is placed over the free end 11 of the clip 10, leg 12 of the clip is inserted into the open end 32 of the housing 30. As the clip 10 is inserted into the housing 30, the curved end 18 flexes as the base 14 is pushed downward due to the force generated between the raised shoulder 16 of the base 14 and the underside 37 (FIG. 1) of the housing 30. After the clip enters the housing a predetermined distance, the curved end 18 of the clip engages the bottom wall 31 of the housing 30. In addition, the shoulder 16 of the clip releases upward to engage the closed end 33 of the housing 30, thus locking the clip into the housing.

When the clip 10 is fully inserted into the housing 30, the parallel spaced electrical contacts 22 on the surface of the ribbon conductor 20 engage the electrical contacts 38 contained within the channels 34 of the housing 30. As a result of the spring force in the electrical contacts 38, the free end 39 of the contacts maintains electrical connection with the contacts 22 of the ribbon conductor. To disengage the components of the system, the user need only pull downwardly on the shoulder 16 of the base 14 of clip 10 and pull outwardly to withdraw the clip from the housing 30. Although the connector shown in FIG. 14 illustrates the connection of a two-conductor ribbon to a two-wire conductor, a single one or a plurality of conductors on ribbon conductors and wire conductors could be connected utilizing the structural concepts of the preferred embodiment shown.

Figure 5:
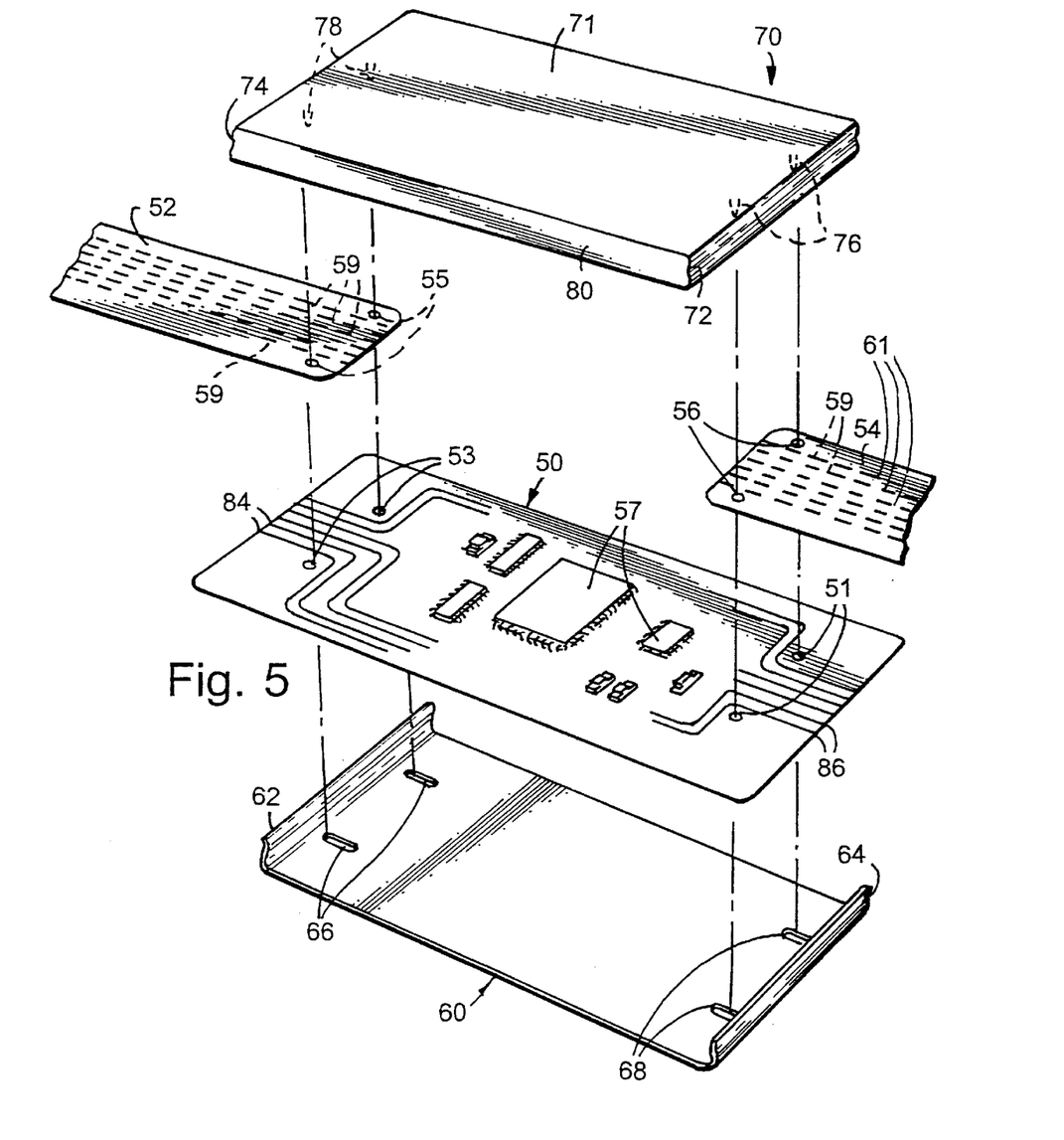
FIG. 5 is an enlarged, perspective and partially broken away exploded view of an alternative embodiment of the electrical conductor connecting system.
Figure 6:
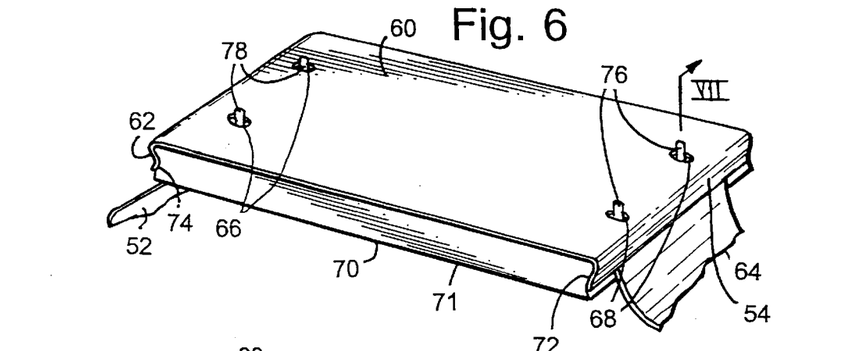
FIG. 6 is a perspective fragmentary view of the electrical conductor connecting system of FIG. 5 shown when assembled.
Figure 7:
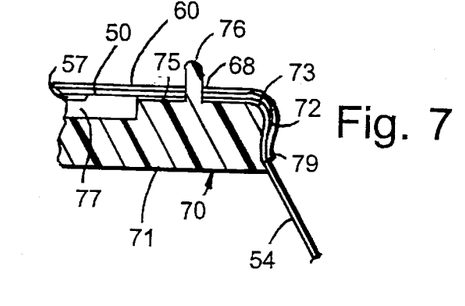
FIG. 7 is an enlarged fragmentary cross-sectional view of the electrical conductor connecting system taken along section line VII—VII of FIG. 6.
Figure 8:
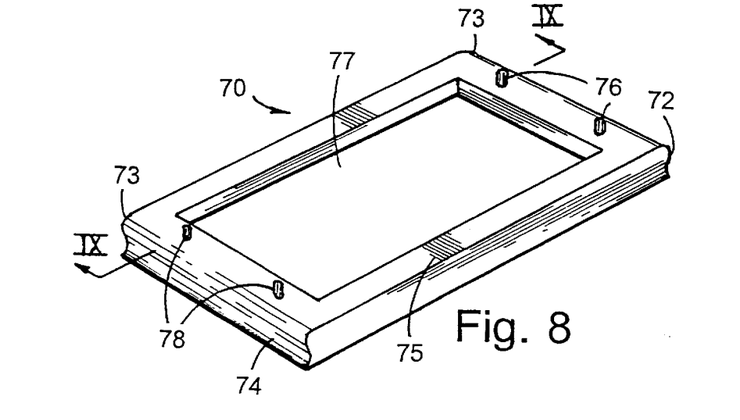
FIG. 8 is a perspective view of the underside of the housing of the system of FIG. 5.
Figure 9:
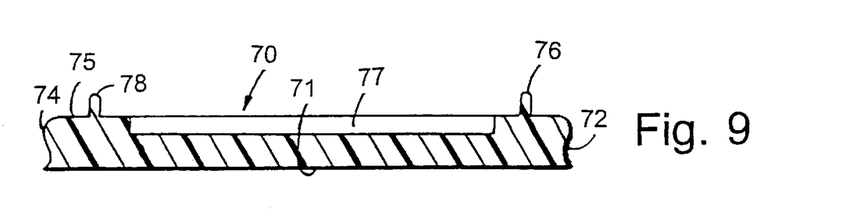
FIG. 9 is a cross-sectional view taken along line IX—IX of FIG. 8.

An alternate press-fit type electrical connector is shown in FIGS. 5–10 in which two ribbon conductors 52, 54 and a flexible or rigid circuit board 50 are electrically coupled by two connecting members including a retainer 60 and a housing 70. The base material of the ribbon conductors is a relatively inexpensive polymeric material and the base material of the single-sided circuit board 50 is made from a polymeric material, such as polyamide, with a high heat tolerance to accommodate molten solder when the surface mounted circuit components 57 are soldered to one side of the board. The flexible retainer 60 is rectangular with opposed curved edges 62, 64. Apertures 68, 66 are formed through the retainer 60 in spaced relationship from the edges. Retainer 60 is shaped to engage the housing 70 and the rectangular circuit board 50 thereon, the circuit board having apertures 51, 53 that align with the apertures 68, 66 of the retainer 60 when the connector is assembled. The housing 70 includes a top panel 71, opposed concave curved ends 72, 74 and opposed edges 80, 82. The bottom panel 75 of the housing 70 has a recess 77 and, as best shown in FIG. 8, includes locating pins 76, 78 extending from its outer edges. The locating pins 76, 78 operate to align the retainer 60, the circuit board and the ribbon conductors when the user assembles the connector. As shown in FIG. 7, the recess 77 of the housing 70 surrounds and protects the electrical components on the circuit board 50 when the connector is assembled.

To make the electrical and mechanical connection between the components, apertures 55, 56 at the free ends of the ribbon conductors 52, 54, respectively, are placed against and aligned with the apertures 53, 51 of the circuit board 50, respectively, after the circuit board has been placed on the housing 70. The retainer 60 is then snapped over the housing 70 with pins 76, 78 of housing 70 passing through the apertures in the ribbon conductors 55, 56, the apertures in the circuit board 53, 51 and the apertures in the retainer 66, 68, respectively, to insure that the mating conductors remain properly aligned.

When retainer 60 is snapped over the housing 70, a lip 73 of each edge 72, 74 of the housing 70 engages a lip 79 of the opposed edges 64, 62 of the retainer causing the edges of the retainer to flex outward creating a spring force in the edges of the retainer. As the retainer 60 is pushed further onto the housing 70, edges 72, 74 of the housing engage the edges of the retainer 64, 62. The edges 72, 74 of the housing 70 are adapted to mate with the edges 64, 62 of the retainer, thus partially releasing the spring force in edges 64, 62 and allowing the edges 64, 62 to "grab" both the housing 70 and the ribbon conductors 54, 52 therebetween. As a result, the surface conductors 59, 61 on the underside of the ribbon conductors 52, 54 press against the surface conductors 84, 86 on the surface of the circuit board 50, thus maintaining an electrical connection.

Figure 10:
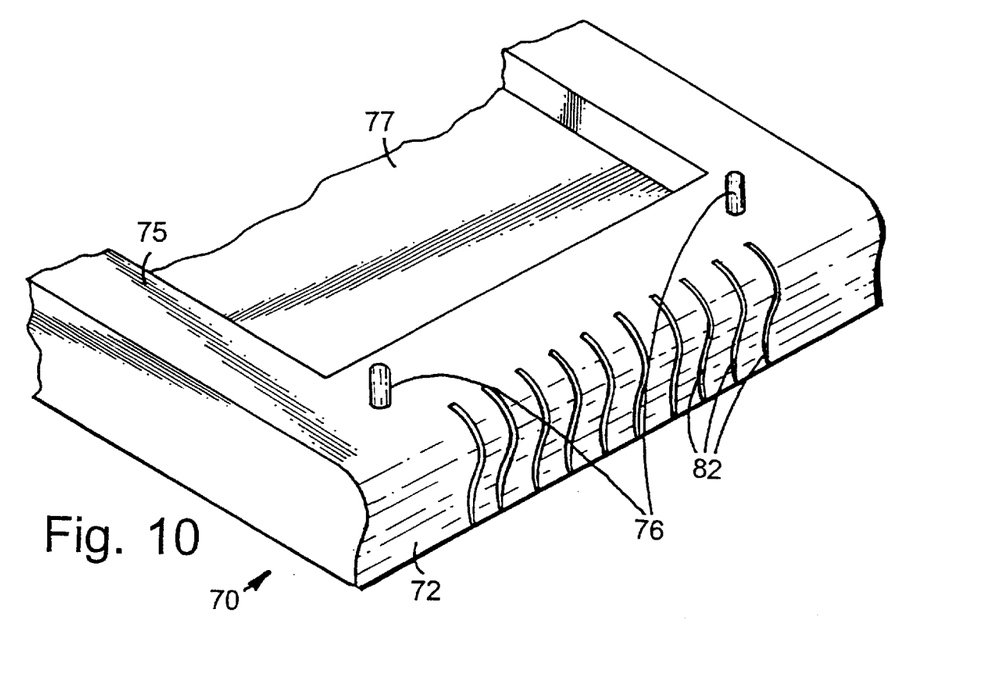
FIG. 10 is a fragmentary, perspective view of an alternate embodiment of the edge of the housing of FIG. 5.

When the components of the system are sandwiched together as shown in FIG. 6, the pins mounted on the underside of the housing 70 operate first to prevent movement of the components, and second to insure that the conductors 59, 61 on the ribbon conductors 52, 54 and the conductors 84, 86 on the surface of the circuit board 50 remain aligned. In addition, because the ribbon conductors 52, 54 are pinched between the edges 62, 64 of the retainer 60 and the edges 74, 72 of the housing 70, these edges operate to provide strain relief for the ribbon conductors 52, 54. Preferably, the housing 70 is molded from a polymeric material and the retainer 60 is made from "flex-steel" that can flex at its edges. In an alternate embodiment of this connector, the housing has a series of raised ridges 82 molded into its edges 72, 74, as shown in FIG. 10. These ridges define pressure points which force the retainer 60 to grip the housing 70 at the surface conductors 59, 61 of each ribbon conductor 52, 54 to further insure proper alignment of the components and, therefore, the integrity of the electrical connection.

The steel retainer is suitably electrically insulated from contact with the circuit board 50, its components and conductors 52, 54. In the preferred embodiment, this insulation is provided by the polyamide material used to manufacture the base of the circuit board. In addition, although a rectangular structure is illustrated, square or other shapes could also be employed. Furthermore, the retainer 60 and housing 70 could be adapted to provide a four-way electrical connection by constructing the edges adjacent to the edges described above in the same concave configuration so they are adapted to engage each other and, for a rectangular shape, a series of four ribbon conductors (not shown).

Figure 11:
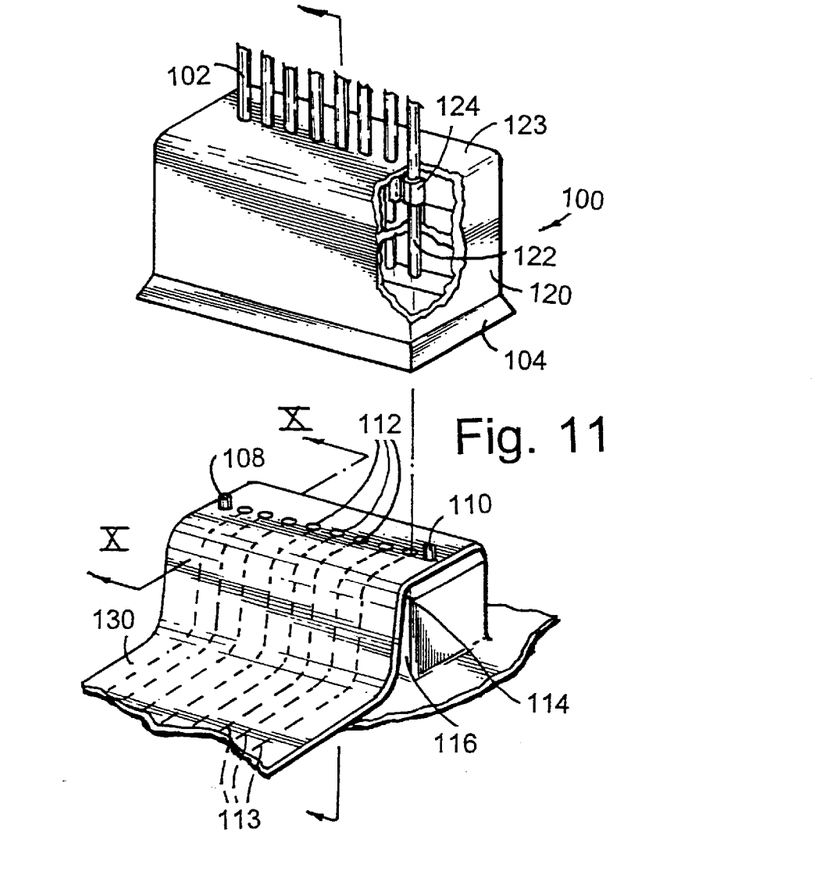
FIG. 11 is a fragmentary, perspective view in exploded form of an alternative embodiment of the electrical conductor connecting system.
Figure 12:
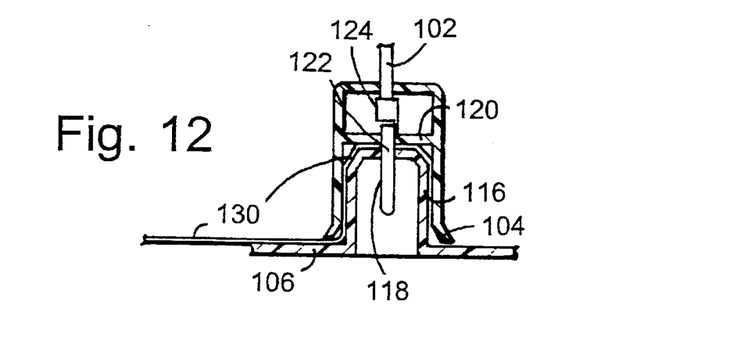
FIG. 12 is a vertical cross-sectional view of the electrical conductor connecting system of FIG. 9, shown fully assembled and taken along section line X—X of FIG. 11.

An alternate press-fit type electrical connector is shown in FIGS. 11 and 12, which incorporates an insulated mounting mandrel 106 containing spaced locating posts 108, 110 and a series of apertures 118 along the length of the center top surface 115 of the mandrel 106. The mandrel 106 is adapted to receive a female wire connector 100 which is flared around its bottom peripheral edges 104 and contains a series of wire conductors 102 lengthwise along its center. The wire conductors 102 of the wire harness 100 are connected to contact pins 122 by a crimp fastener 124. In addition, the wires 102 are molded in the top surface 123 of the wire harness connector 100 to provide strain relief.

To connect the wire conductors 102 to a ribbon conductor 130, the ribbon conductor is first draped over the mandrel 106. The ribbon conductor has a series of apertures 112 extending through printed electrical conductors 113 of the ribbon conductor 130 and which are smaller in diameter than the apertures 118 on the mandrel 106. The locating posts 108, 110 at either end of the top surface of the mandrel 106 are adapted to engage the outer apertures of the ribbon conductor 130 when the ribbon conductor is positioned over the mandrel. As a result, the ribbon conductor 130 is retained on the mandrel 106 and the apertures 112 of the ribbon conductor align with apertures 118 in the top surface 115 of the mandrel. Then, the female wire connector 100 is placed over the mandrel 106 and pushed onto the mandrel until the contact pins 122 within the wire harness engage the apertures 112, including the electrical contacts (not shown) attached to the electrical conductors 113, of the ribbon conductor 130. As the contact pins 122 pass through the apertures 112 of the ribbon conductor and through the apertures 118 of the mandrel, the apertures in the ribbon conductor, including the polymeric base material and the electrical contacts thereon, deform and "grip" the contact pins, thus providing both an electrical and mechanical connection between the contact pins 122 and the electrical contacts in each aperture of the ribbon conductor 130. In addition, the walls of the wire harness snugly press against the walls 116 of the mandrel to further minimize the possibility of inadvertent disengagement of the wire harness from the mandrel.

As best shown in FIG. 12, when the electrical connector is fully assembled, the contact pins 122 attached to the wire conductors 102 enter the mandrel 106 a sufficient distance to insure electrical connection between the series of wire conductors 102 and the conductors of the ribbon cable 130. In addition, the wire harness 100 contains a stop 120 to minimize movement of the pins 122 within the wire harness so that each pin enters the corresponding apertures 118, 112 of the mandrel and ribbon cable, respectively. As a result, the system may be subject to multiple engagements and disengagements without disturbing the alignment between the pins and corresponding apertures.

Figure 13:
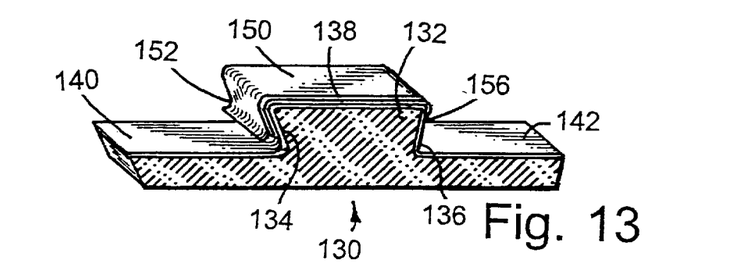
FIG. 13 is a vertical cross-sectional view of yet another embodiment of this invention.

In FIG. 13 there is shown yet another embodiment of the invention in which a mandrel 130 is made of an insulative material and has an upwardly extending shoulder 132 with inwardly concavely curved opposed edges 134, 136. The mandrel 130 is shaped to allow the connection of a first flexible ribbon conductor 140 to a second overlapping flexible ribbon conductor 142 which overlaps at the top surface 138 of mandrel 130. The flexible conductors 140, 142 have exposed conductive traces which are aligned and face one another in overlapping contacting relationship over the top surface 138 of mandrel 130. A spring retainer clip 150, having edges 154, 156 corresponding to the curvature of edges 134, 136 of mandrel 130, is snapped over the overlapped flexible circuits and mandrel to interconnect the two circuits. The mandrel 130 may, as in the embodiment shown in FIGS. 5–9, include indexing posts which extend upwardly through apertures in the retainer clip and in the conductors 140, 142 for aligning and indexing the interconnected flexible conductors and the retainer to the mandrel. Mandrel 130 is made of an insulator material while clip 150 can be made of steel and is suitably insulated from the conductive elements of ribbon conductors 140, 142 either by the substrates of the conductors or by a layer of insulating material between the surface of clip 150, which faces the conductors, and the conductors.

It will become apparent to those skilled in the art that various modifications to the preferred embodiment of the invention as described herein can be made without departing from the spirit or scope of the invention as defined by the appended claims.

The embodiments of the invention in which an exclusive property or privilege is claimed are defined as follows:

1. An electrical conductor connecting system comprising:
   a wire conductor housing defining an opening enclosed by a wall, said housing including at least one electrical contact for engaging a conductor of a ribbon conductor; and
   a generally U-shaped clip having a leg with an end over which a ribbon conductor extends to lie adjacent opposite sides of said leg, said clip including a base with a shoulder positioned to engage said wall of said housing on a side of said housing opposite said opening when said leg of said clip is inserted into said housing to lock said clip into said housing.

2. The system as defined in claim 1 wherein said housing includes an internal upper surface having at least one channel to retain said electrical contact.

3. The system as defined in claim 2 wherein said electrical contact is connected to a wire conductor.

4. The system as defined in claim 3 wherein said leg of said clip is joined to said base by a closed continuous curved end.

5. The system as defined in claim 4 wherein said clip is integrally molded of a resilient polymeric material and said shoulder of said base locks said leg of said clip in said housing.

6. The system as defined in claim 5 and further including a ribbon conductor having a top surface containing at least one exposed conductor which contacts a corresponding electrical contact within said housing when said clip is locked into said housing.

7. The system as defined in claim 1 wherein said housing and said clip are made of a polymeric material.

8. An electrical component connecting system comprising:
   a housing having walls defining a box and having a flat panel containing a recess adapted to enclose electrical circuit components on a circuit board and at least one ribbon conductor to be coupled to said circuit board; and
   a retainer defined by a base and opposed raised edges, wherein said edges of said retainer flex in response to a downward compressive force applied to said housing when said retainer is pressed onto said housing for sandwiching said circuit board and said ribbon conductors in electrical contact.

9. The system as defined in claim 8 wherein said walls of said housing are shaped to lockably engage said edges of said retainer when said housing and said retainer are pressed together.

10. The system as defined in claim 9 wherein said edges of said retainer are curved and grip said housing to clamp said ribbon conductor between said edge of said retainer and a corresponding wall of said housing to retain the ribbon conductor between said housing and said retainer.

11. The system as defined in claim 10 wherein said housing contains at least one locator pin attached to said flat panel of said housing, said pin extending outwardly from said housing.

12. The system as defined in claim 11 wherein said retainer contains at least one aperture aligned to receive said at least one pin.

13. The system as defined in claim 12 wherein said ribbon conductor contains an exposed electrical conductor and the edge of the top surface of said circuit board contains a corresponding exposed electrical conductor.

14. The system as defined in claim 13 wherein said walls of said housing contain a series of spaced ridges in the shape of said edges of said housing.

15. The system as defined in claim 14 wherein said retainer engages said ridges of said walls of said housing and each said exposed electrical conductor of said ribbon conductors when said electrical component connecting system is assembled.

16. The system as defined in claim 15 wherein said apertures of said retainer align with at least one aperture formed in said ribbon conductor and at least one aperture formed in said circuit board so that when said housing and said retainer are pressed together said pin of said housing passes through said at least one aperture of said ribbon conductor and at least one aperture of said circuit board and through said at least one aperture of said retainer to align said electrical conductor on said circuit board with said exposed electrical conductor of said ribbon conductor to prevent movement of said retainer, said ribbon conductor and said circuit board relative to said housing.

17. The system as defined in claim 16 wherein said exposed electrical contact of said ribbon conductor aligns with and contacts said exposed electrical conductor of said circuit board when said housing and said retainer are pressed together.

18. The system as defined in claim 8 wherein said housing is made from a polymeric material.

19. The system as defined in claim 8 wherein said retainer is made from steel.

20. An electrical component connecting system comprising:
   a mandrel projecting outwardly from a base, said mandrel having a top surface containing a plurality of apertures therein and exterior walls extending to said base; and
   a female wire connector containing a series of contact pins therein and shaped to extend over said mandrel, wherein a ribbon conductor containing a series of apertures can be positioned over said mandrel and sandwiched between said mandrel and said female wire connector when said female wire connector is plugged onto said mandrel.

21. The system as defined in claim 20 wherein said apertures of said ribbon conductor have a diameter smaller than the diameter of contact pins of said female wire connector such that said apertures of said ribbon conductor, including the base material of said ribbon conductor and electrical surface conductors of said ribbon conductor, are deformed when said contact pins engage said apertures thus maintaining electrical and mechanical connection between said contact pins of said female wire connector and said ribbon conductor.

22. The system as defined in claim 20 wherein said top surface of said mandrel contains at least one locating post mounted thereon to align said apertures of said ribbon conductor with said apertures of said mandrel.

23. The system as defined in claim 22 wherein the interior of said female wire connector contains a stop to align said contact pins of said female wire connector and to engage said top surface of said mandrel after said contact pins pass through said apertures of said ribbon conductor and enter said apertures of said mandrel a predetermined distance.

24. The system as defined in claim 23 wherein said ribbon conductor is sandwiched between the interior walls of said female wire connector and exterior walls of said mandrel.

25. The system as defined in claim 20 wherein said mandrel is made from a polymeric material.

26. A system for mechanically and electrically coupling a pair of flexible ribbon conductors with aligned facing conductive strips thereon comprising:
   a mandrel having a raised section with a flat top and opposed curved sidewalls for receiving overlapping ribbon conductors on said top; and
   a snap-on retainer clip having a pair of opposed curved edges at opposite ends of a center section, which edges conform to and snap into said sidewalls of said mandrel to hold ribbon conductors in compressive relationship between said clip and said mandrel.

27. The system as defined in claim 26 wherein said mandrel has concavely curved sidewalls.

28. The system as defined in claim 27 wherein said mandrel is made of an insulator.

29. The system as defined in claim 28 wherein said retainer is made of steel.

* * * * *

UNITED STATES PATENT AND TRADEMARK OFFICE
CERTIFICATE OF CORRECTION

PATENT NO. : 6,000,951
DATED : December 14, 1999
INVENTOR(S) : Hansen et al.

It is certified that error appears in the above-identified patent and that said Letters Patent is hereby corrected as shown below:

Column 7, line 34;
    After "housing" insert --including sidewalls and an end wall--.

Column 7, lines 34 and 35;
    Delete "enclosed by a wall".

Column 7, line 38;
    Delete "a" (second occurrence) and insert therefor --first and second legs, each having a width corresponding to the width of said opening, wherein said first--.

Column 7, line 38;
    Delete "with" and insert therefor --has--.

Column 7, line 40;
    After "," insert --and wherein--.

Column 7, line 40;
    Delete "clip including a base with" and insert therefor --second leg is longer than said first leg and has--.

Column 7, line 41;
    Delete "positioned" and insert therefor --extending toward said first leg and positioned--.

UNITED STATES PATENT AND TRADEMARK OFFICE
CERTIFICATE OF CORRECTION

PATENT NO. : 6,000,951  
DATED : December 14, 1999  
INVENTOR(S) : Hansen et al.

Page 2 of 3

It is certified that error appears in the above-identified patent and that said Letters Patent is hereby corrected as shown below:

Column 7, line 41;
  After "said" (first occurrence) insert --end--.

Column 7, line 42;
  Delete "housing" and insert therefor --end wall--.

Column 7, line 43;
  "said leg" should be --said first leg--.

Column 7, line 43;
  After "is" insert --fully--.

Column 7, line 50;
  Delete "leg" and insert therefor --first and second legs--.

Column 7, line 51;
  Delete "is" and inset therefor --are--.

Column 7, line 51;
  Delete "to said base".

Column 7, line 57;
  Delete "5" and insert therefor --4--.

UNITED STATES PATENT AND TRADEMARK OFFICE
CERTIFICATE OF CORRECTION

PATENT NO. : 6,000,951
DATED : December 14, 1999
INVENTOR(S) : Hansen et al.

It is certified that error appears in the above-identified patent and that said Letters Patent is hereby corrected as shown below:

Column 8, line 63;
After "therein" insert --for receiving contact pins therein--.

Column 8, line 65;
After "therein" insert --, said female wire connector--.

Column 8, line 65;
Delete "and".

Column 8, line 65;
After "mandrel" insert --with said contact pins extending into said apertures of said mandrel--.

Signed and Sealed this

Twenty-sixth Day of September, 2000

*Attest:*

Q. TODD DICKINSON

*Attesting Officer*   *Director of Patents and Trademarks*